(12) United States Patent
Um et al.

(10) Patent No.: US 9,442,333 B2
(45) Date of Patent: Sep. 13, 2016

(54) PIXEL ELECTRODE, ARRAY SUBSTRATE AND DISPLAY DEVICE

(71) Applicant: BOE TECHNOLOGY GROUP CO., LTD., Beijing (CN)

(72) Inventors: Yoon Sung Um, Beijing (CN); Heecheol Kim, Beijing (CN); Hyun Sic Choi, Beijing (CN); Hui Li, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/364,492

(22) PCT Filed: Dec. 12, 2013

(86) PCT No.: PCT/CN2013/089311
§ 371 (c)(1),
(2) Date: Jun. 11, 2014

(87) PCT Pub. No.: WO2015/039392
PCT Pub. Date: Mar. 26, 2015

(65) Prior Publication Data
US 2015/0108486 A1  Apr. 23, 2015

(30) Foreign Application Priority Data
Sep. 18, 2013  (CN) .......................... 2013 1 0429986

(51) Int. Cl.
| G02F 1/1343 | (2006.01) |
|---|---|
| G02F 1/1362 | (2006.01) |
| G02F 1/1368 | (2006.01) |
| H01L 27/12 | (2006.01) |
| G02F 1/1337 | (2006.01) |

(52) U.S. Cl.
CPC ......... *G02F 1/13439* (2013.01); *G02F 1/1368* (2013.01); *G02F 1/133707* (2013.01); *G02F 1/134309* (2013.01); *G02F 1/136286* (2013.01); *H01L 27/124* (2013.01); *G02F 2001/134381* (2013.01); *G02F 2201/123* (2013.01)

(58) Field of Classification Search
CPC ....................... G02F 1/134363; H01L 27/124
See application file for complete search history.

(56) References Cited

U.S. PATENT DOCUMENTS

| 6,611,310 B2 | 8/2003 | Kurahashi et al. |
| 7,023,516 B2 * | 4/2006 | Yoshida ............... G02F 1/1393 349/129 |

(Continued)

FOREIGN PATENT DOCUMENTS

| CN | 1374546 A | 10/2002 |
| CN | 1673841 A | 9/2005 |

(Continued)

OTHER PUBLICATIONS

English Translation of the International Search Report of PCT/CN2013/089311 published in English on Mar. 26, 2015.

(Continued)

*Primary Examiner* — John C Ingham
(74) *Attorney, Agent, or Firm* — Collard & Roe, P.C.

(57) ABSTRACT

A pixel electrode, an array substrate and a display device are configured to provide a display apparatus with higher transmittance. The pixel electrode includes at least one electrode unit, wherein the electrode unit includes a plurality of strip electrodes and has a non-closed shape.

17 Claims, 14 Drawing Sheets

(56) References Cited

U.S. PATENT DOCUMENTS

| | | | |
|---|---|---|---|
| 7,714,969 B2 | 5/2010 | Asakura et al. | |
| 8,593,584 B2 | 11/2013 | Itoh et al. | |
| 2005/0046779 A1 | 3/2005 | Sumi et al. | |
| 2007/0024789 A1* | 2/2007 | Itou et al. | 349/139 |
| 2012/0249930 A1* | 10/2012 | Takano | G02F 1/133526 349/95 |
| 2013/0033654 A1* | 2/2013 | Kim et al. | 349/38 |

FOREIGN PATENT DOCUMENTS

| | | |
|---|---|---|
| CN | 101344687 A | 1/2009 |
| CN | 101344687 B | 6/2010 |
| CN | 102804047 A | 11/2012 |
| CN | 102914922 A | 2/2013 |

OTHER PUBLICATIONS

Second Chinese Office Action of Chinese Application No. 201310429986.X with English translation, mailed Dec. 9, 2014.
International Search Report, International Preliminary Report on Patentability and Written Opinion of the International Searching Authority of PCT/CN2013/089311 in Chinese, mailed Jun. 9, 2014.
Chinese Office Action of Chinese Application No. 201310429986. Xwith English translation, mailed Aug. 27, 2014.
English translation of the International Preliminary Report on Patentability and Written Opinion of the International Searching Authority of PCT/CN2013/089311, issued Mar. 22, 2016.

* cited by examiner

PIXEL ELECTRODE, ARRAY SUBSTRATE AND DISPLAY DEVICE

CROSS REFERENCE TO RELATED APPLICATIONS

This application is the National Stage of PCT/CN2013/089311 filed on Dec. 12, 2013, which claims priority under 35 U.S.C. §119 of Chinese Application No. 201310429986.X filed on Sep. 18, 2013, the disclosure of which is incorporated by reference.

TECHNICAL FIELD

Embodiments of the present invention relate to a pixel electrode, an array substrate and a display device.

BACKGROUND

A thin film transistor liquid crystal display (TFT-LCD) has characteristics such as small size, low power consumption, no radiation and the like, and has dominated in the current market of the flat panel display.

A core technology represented by a wide viewing angle technology especially becomes a hot topic in recent years.

A core technology of plane electric field with wide viewing angle—Advanced Super Dimension Switch (ADS) is as follows: a multi-dimensional electric field is formed by an electric field generated between edges of slit electrodes in the same plane as well as an electric field generated between the slit electrode layer and a plate electrode layer, so that the liquid crystal molecules of all alignment directions between the slit electrodes and directly above the electrode in a liquid crystal cell can rotate, thereby the liquid crystal working efficiency is improved and the light transmission efficiency is increased. Advanced super dimensional switch technology can improve the picture quality of TFT-LCD products, and has the advantages such as high resolution, high transmittance, low power consumption, wide viewing angle, high aperture ratio, low chromatic aberration, no push Mura and the like. For different applications, ADS technology has some improved versions, such as a high transmittance I-ADS technology, a high aperture ratio H-ADS technology and a high resolution S-ADS technology.

A conventional slit pixel electrode as a whole has a rectangular shape. The slit pixel electrode includes a plurality of first electrode structures, the pixel electrode consisted of the first electrode structures has an closed shape, for example, the closed electrode is formed by configuring second electrode structures to close the pixel electrode at both ends of each of the first electrode structures. In the procedure of actual displaying, the liquid crystal molecules gather around each first electrode structure and are deflected under the action of transverse electric field, so as to display images. Some of liquid crystal molecules gather around the second electrode structures on the edges, the distribution of electric field in this region is different from that of electric field around the first electrode structures, so that the liquid crystal molecules in the region around the second electrode structures has a different distribution direction from that of the liquid crystal molecules in the region around the first electrode structures, that is, a disclination happens. Therefore, the liquid crystal molecules in the region around the second electrode structures cannot be effectively utilized, thereby pixel aperture ratio is not improved at optimal and the light transmittance that achieves image display is not high enough.

SUMMARY

Embodiments of the present invention provide a pixel electrode, an array substrate and a display device to provide a display apparatus with high light transmittance.

According to embodiments of the present invention, the pixel electrode comprises at least one electrode unit, wherein the electrode unit includes a plurality of strip electrodes and has a non-closed shape.

In an example, each electrode unit comprises a plurality of first strip electrodes extending along a same direction and second strip electrodes each located between two adjacent first strip electrodes and configured to connect the two adjacent first strip electrodes, and a structure formed of the two adjacent first strip electrodes and the second strip electrode is not closed.

In an example, each of the second strip electrodes is located at a same end of each of the first strip electrodes; or at least one of the second strip electrodes is located at one end of each of the first strip electrodes, the other second strip electrodes are located at the opposite end; or at least one of the second strip electrodes is located at a region of the first strip electrode that is far away from two ends of the first strip electrode.

In an example, the first strip electrode has a line-like shape or a fold line-like shape with a bending point.

In an example, when the first strip electrodes have a fold line-like shape with a bending point, the bending point of each of the first strip electrodes has a same bending direction and a same bending degree, and each bending point is located in a same line, electrode portions between the two ends and the bending point of each first strip electrode form a mirror symmetry.

In an example, the pixel electrode includes a first electrode unit and a second electrode unit. The first electrode unit includes first strip electrodes arranged along a first direction, the second electrode unit includes first strip electrodes arranged along a second direction which forms an angle with the first direction; or the first strip electrodes of the first electrode unit and the first strip electrodes of the second electrode unit are arranged along a same direction.

In an example, the first electrode unit electrically connects with the second electrode unit.

According to embodiments of the present invention, an array substrate is provided, the array substrate comprises a plurality of gate lines and a plurality of data lines arranged in an intersectant manner and pixel units formed and surrounded by the gate lines and the data lines, the pixel unit includes a pixel electrode, wherein the pixel electrode is any of above pixel electrodes.

In an example, the first strip electrodes are arranged along a direction in which the data lines extend, the second strip electrodes are extended along a direction in which the gate lines extend; or the first strip electrodes are arranged along a direction in which the gate lines extend, the second strip electrodes are extended along a direction in which the data lines extend; or the first strip electrodes are arranged along a direction which has a second angle with the gate lines, the second strip electrodes extend along a direction in which the data lines extend; or the first strip electrodes are arranged along a direction which has a set second angle with a direction in which the gate lines extend, the second strip electrodes extend along a direction which has a set third angle with a direction in which the data lines extend.

According to embodiments of the present invention, a display device is provided, wherein the display device includes the array substrates.

BRIEF DESCRIPTION OF THE DRAWINGS

Embodiments of the present invention will be described in more detail below with reference to the accompanying drawings to allow one of ordinary skill in the art to understand the present invention more clearly, and wherein.

DETAILED DESCRIPTION OF THE PREFERRED EMBODIMENTS

Figure 1:
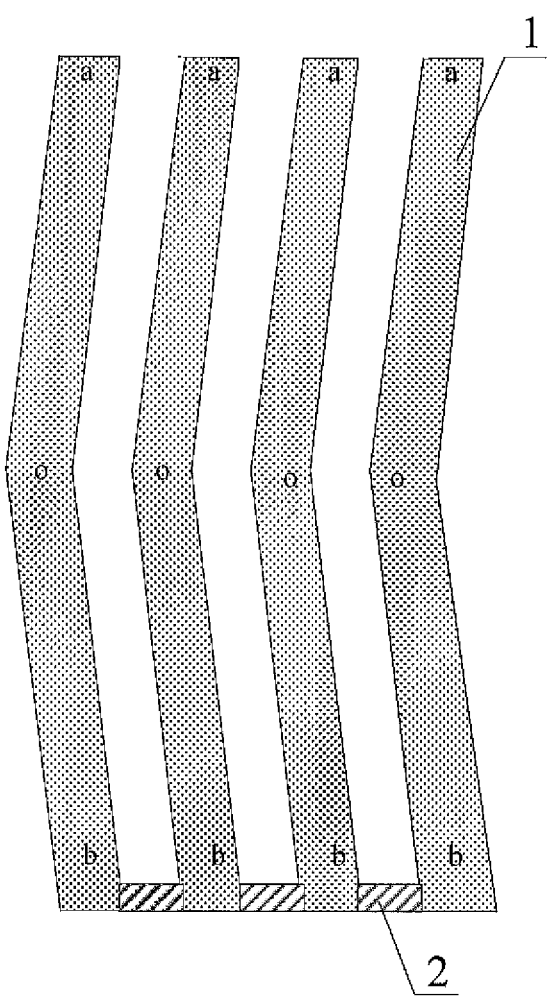
FIG. 1 shows a structural schematic view of a pixel electrode provided in a first embodiment of the present invention.

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments and variants can be obtained by those of ordinary skill in the art without creative labor and those embodiments and variants shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and when the position of the object which is described is changed, the relative position relationship may be changed accordingly.

Embodiments of the present invention provide a pixel electrode, an array substrate and a display device to form a display apparatus with high light transmittance and a wide viewing angle.

According to embodiments of the present invention, the pixel electrode is a slit pixel electrode, that is, a pixel electrode including a plurality of strip electrodes, wherein a slit is formed between the adjacent strip electrodes. The shape of the strip electrode can be a line-like shape "|" or a fold line-like shape "<" or the like.

According to embodiments of the present invention, a non-closed pixel electrode (i.e., a pixel electrode with an aperture,) is provided, which can decrease or avoid partial disclination caused by the liquid crystal molecules having different distribution directions, thereby utilization rate of liquid crystal molecules distributed on sub-pixel edge and light transmittance of sub-pixel region are improved. Typically, one pixel unit includes a plurality of color sub-pixel units in color display device, such as red sub-pixel units, green sub-pixel units and blue-sub pixel units.

It should be noted that the term "aperture" on the pixel electrode referred in the present invention is cutout (also referred to as gap).

The pixel electrode includes at least one electrode unit, wherein the electrode unit includes a plurality of strip electrodes each of which forms an electrode unit in a non-closed shape, that is, the electrode unit formed by the strip electrodes has an aperture.

Technical solutions provided in embodiments of the present invention will be described in more detail below with reference to the accompanying drawings. The structures of the accompanying drawings of the present invention merely illustrate the present invention but they are not intended to limit the present invention, and the relative distances and sizes of the features or structures do not represent real relative distances and size.

Embodiment 1

A Pixel Electrode Includes One Electrode Unit

Referring to FIG. 1, the electrode unit of the pixel electrode includes a plurality of first strip electrodes 1 extending along a same direction, wherein a slit is formed between two adjacent first strip electrodes, and a slit electrode is formed thereof; and a second strip electrode 2 located between any of two adjacent electrodes 1 and configured to connect the two adjacent first strip electrodes 1, wherein a structure formed of the two adjacent first strip electrodes 1 and the second strip electrode 2 is not closed.

It should be noted that the first strip electrodes as a whole has a strip shape, such as a line-like shape "|" or a fold line-like shape having a bending point in the center region. For example, the fold line-like shape can be a bracket shape "<" or ">" or the like, but not limited thereto. In the pixel electrode as shown in FIG. 1, the first strip electrode 1 has a fold line-like shape, which will be described in detail below.

The two adjacent first strip electrodes 1 and the second strip electrode 2 form a non-closed structure via various manners. FIG. 1 merely shows one way of implementation, various implementations will be described in detail below.

According to the described pixel electrode provided in the embodiments of the present invention, the structure formed by two adjacent first strip electrodes and the second strip electrode is not closed, that is, it has an aperture. Liquid crystal molecules around one end of the first strip electrode on which the second strip electrode is not configured have the same orientation with that of the liquid crystal molecules around the center region of the first strip electrode, that is, disclination is not existed. The end of the first strip electrode on which the second strip electrode is not configured can normally drive the nearby liquid crystal molecules to be deflected, which improve effective utilization of the liquid crystal molecules in the corresponding region of the pixel electrode on which the second strip electrode is not configured.

Figure 2:
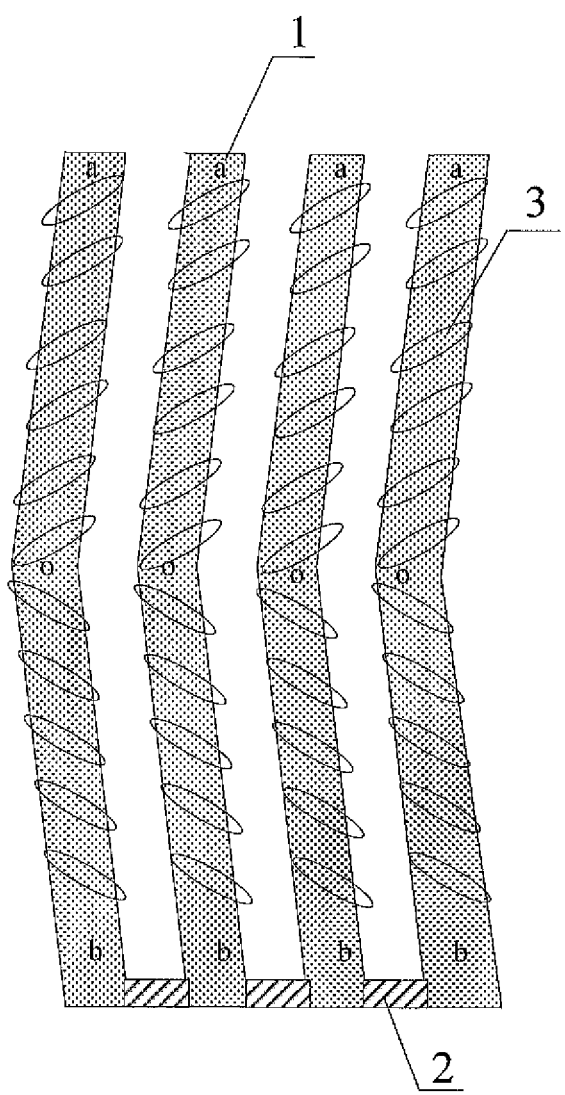
FIG. 2 shows a distribution schematic diagram of the liquid crystal molecules when a voltage is applied to the pixel electrode as shown in FIG. 1.

Referring to FIG. 2, it shows a distribution diagram of the liquid crystal molecules 3 in the region at which the first strip electrodes 1 are located when a voltage is applied to the pixel electrode. It can be seen form FIG. 2, the liquid crystal molecules 3 around a first end a of the first strip electrodes 1 have the same orientation with that of the liquid crystal molecules 3 close to the center region of the first strip electrode 1. There is no disclination between the orientation of the liquid crystal molecules 3 around the first ends a of the first strip electrodes 1 and that of the liquid crystal molecules 3 close to the center region of the first strip electrodes 1 (the center region is a middle position of an edge in the extension direction of the strip electrode). The first ends a of the first strip electrodes 1 can normally drive the nearby liquid crystal molecules 3 to be deflected, which improve effective utilization of the liquid crystal molecules in the corresponding region of the pixel electrode.

Figure 3:
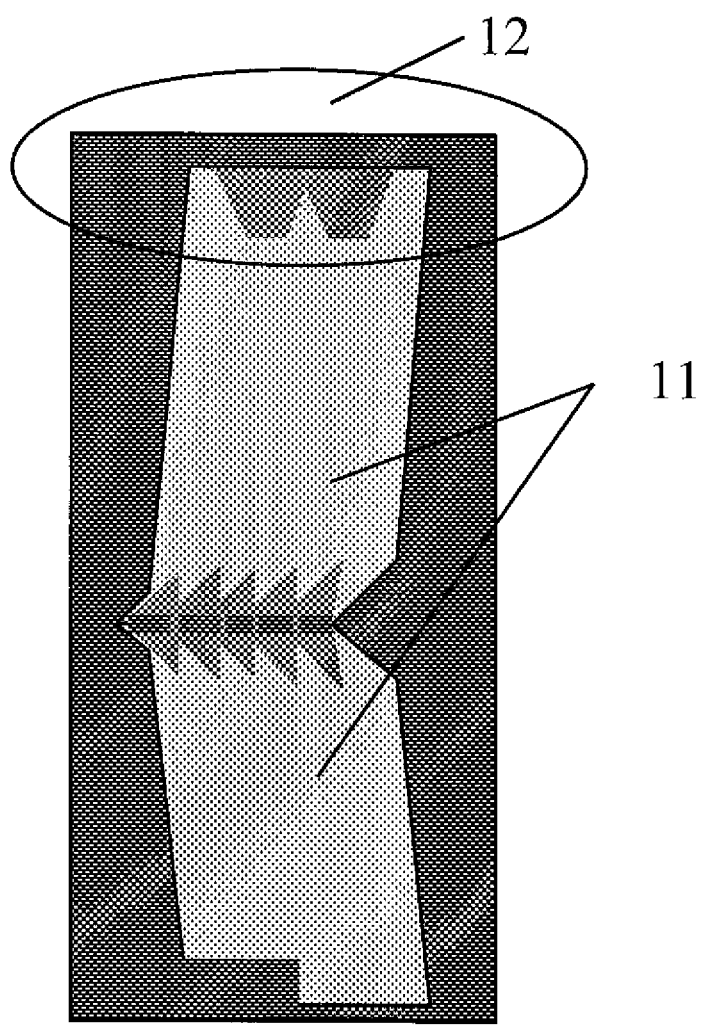
FIG. 3 shows a luminance distribution schematic diagram of a white image correspondingly displayed via a conventional pixel electrode.

Referring to FIG. 3, it shows a luminance distribution diagram of a white image displayed by corresponding region of one pixel electrode in a conventional display device. The first strip electrodes correspond to image luminance areas 11, the ends of the first strip electrodes correspond to image luminance areas 12. It can be seen from FIG. 3, image luminance areas 12 corresponding to the ends of the first strip electrodes have non-uniform luminance distribution, the region near to the edge of the first strip electrode has a darker image luminance; therefore, the liquid crystal molecules in corresponding region of the pixel electrode have lower effective utilization in the conventional technology.

Figure 4:
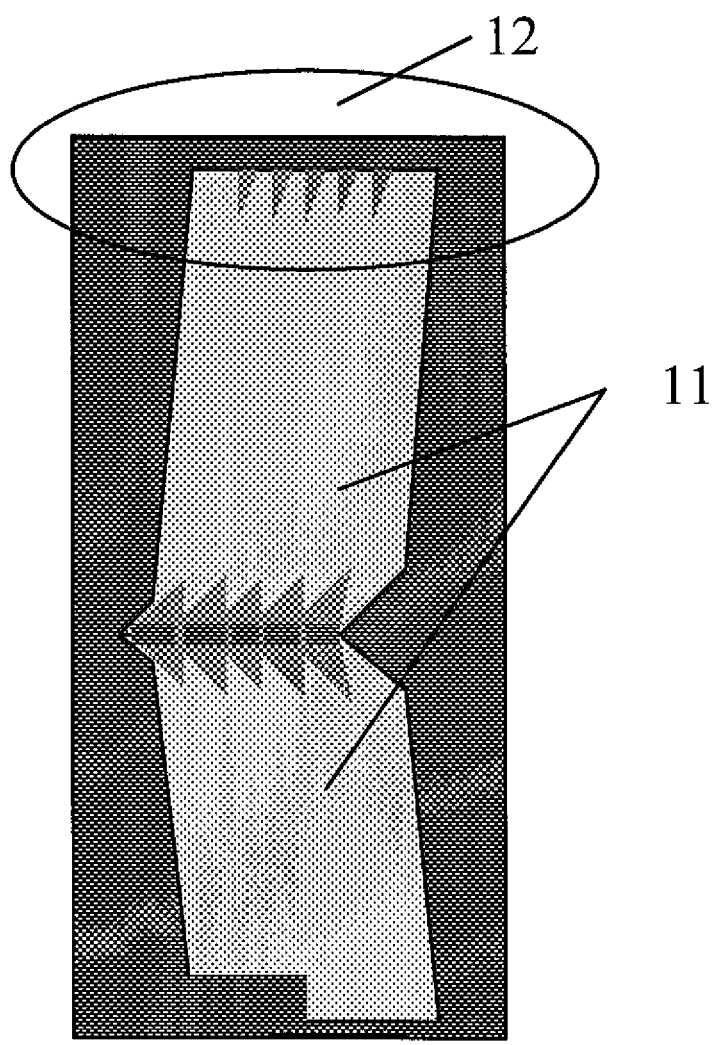
FIG. 4 shows a luminance distribution diagram of a white image correspondingly displayed via the pixel electrode as shown in FIG. 2.

Referring to FIG. 4, it shows a luminance distribution diagram of a white image displayed by corresponding region of a pixel electrode in the display device according to embodiments of the present invention. The luminance distribution diagram includes the image luminance area 11 corresponding to the first strip electrodes and the image luminance area 12 corresponding to the ends a (the ends having apertures) of the first strip electrodes 1 shown in FIG. 2. It can be seen from FIG. 4 that the image luminance area 12 and image luminance area of the image luminance area 11 except the image luminance area 12 have almost same luminance, or the image luminance area 12 has luminance slightly less than that of the area outside the image luminance area 12. Therefore, it indicates that the pixel electrode structure provided in the first embodiment of the present invention improves the effective utilization of the liquid crystal molecules of corresponding region of the pixel electrode.

The two adjacent first strip electrodes and the second strip electrode form a non-closed structure via various manners.

For example, only one second strip electrode is included between two adjacent first strip electrodes, and the second strip electrode can be located in any position between two adjacent first strip electrodes as long as the two adjacent first strip electrodes electrically connect with each other; or a plurality of second electrodes are included between the two adjacent first strip electrodes, and the second electrodes are only located at first ends or second ends of the two adjacent first strip electrodes or can be located in other positions besides the first ends or the second ends of the first strip electrodes.

In one embodiment, only one second strip electrode is included between the two adjacent first strip electrodes, for example, which can be implemented at least by the following three approaches: 1) each of the second strip electrode is located at same end of each of the first strip electrodes; 2) at least one of the second strip electrodes is located at one end of the first strip electrodes and the other second strip electrodes are located at the other end of the first strip electrodes; 3) at least one of the second strip electrodes is located at the region far away from the ends of the first strip electrodes.

In above three implementations, the angle between the second strip electrode and the first strip electrode can be any degree, as long as the two adjacent first strip electrodes electrically connect with each other.

For example, the angle between the second strip electrode and the first strip electrode is 90 degree (that is, the first strip electrode is perpendicular to the second strip electrode) so that the length of the second strip electrode is as small as possible.

For example, the pixel electrode as shown in FIG. 1 corresponds to a pixel electrode provided in the approach 1), wherein each of the second strip electrodes is located at a same end (end b) of each of the first strip electrodes, and the second strip electrodes are perpendicular to the first strip electrodes. The term "perpendicular" means herein that the first strip electrodes and the second strip electrodes are substantially perpendicular to each other as a whole. In other words, if the first strip electrodes have a fold line-like shape, the direction along which the second strip electrodes extend is substantially perpendicular to that of the first strip electrodes extend.

Figure 5:
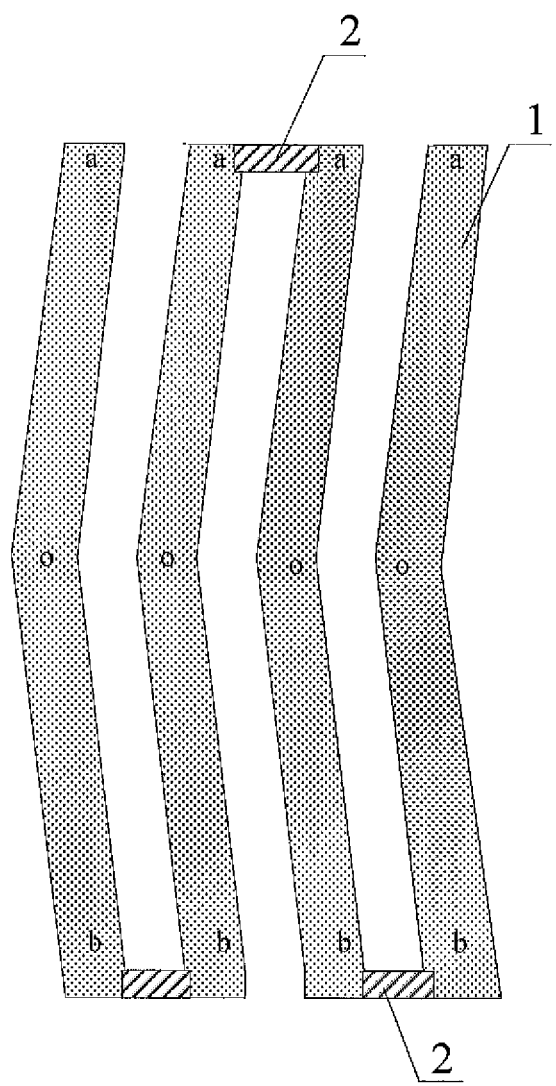
FIG. 5 shows another structural schematic view of the pixel electrode provided in the first embodiment of the present invention.

In the pixel electrode unit, to balance the influence to the liquid crystal molecules when the second strip electrodes 2 are only on the one end (end b in FIG. 1) of each of the first strip electrodes 1 so that the luminance distribution is more uniform, the pixel electrode as shown in FIG. 5 corresponds to a pixel electrode provided in the approach 2), i.e., at least one of the second strip electrodes 2 is located at one end (end a) of the first strip electrodes 1, and the other second strip electrodes are located at the other ends (end b) of the first strip electrodes 1.

For example, the second strip electrodes are alternatively located at one end a and the other end b of the first strip electrodes 1.

Figure 6:
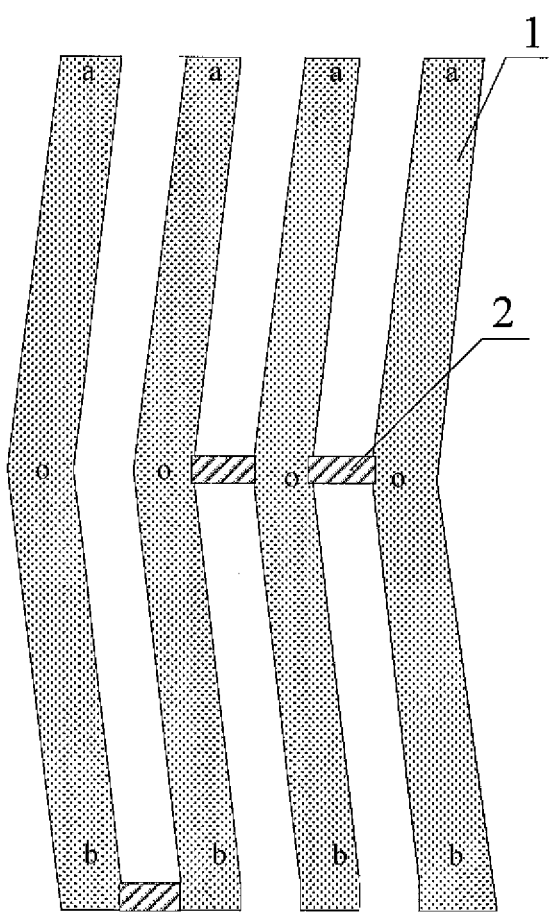
FIG. 6 shows a third structural schematic view of the pixel electrode provided in the first embodiment of the present invention.

The pixel electrode as shown in FIG. 6 corresponds to a pixel electrode provided in the approach 3), i.e., at least one of the second strip electrodes 2 is located at center region (point o) of the first strip electrodes 1. It is to be understood that the second strip electrodes 2 are not limited to be located at the center region of the first strip electrodes 1.

For example, when the first strip electrode is a fold line-like shape electrode having a bending point in center region, the adjacent first strip electrodes 1 connect with each other on the bending point via a second strip electrode 2 so that the electric field difference between the center region and two ends of the first strip electrode 1 is balanced, thereby to advantageously improve the luminance uniform of a displayed image.

In above three types of non-closed structures, approach 1): the configuration that each of the second strip electrodes is located at the same end of each of the first strip electrodes has a simpler manufacturing process compared with those configurations implemented via approaches 2) and 3), the image luminance of the pixel area on which the second strip electrode is not provided is lighter than that of the pixel area on which the second strip electrode is provided.

Approach 2): a second strip electrode is provided on the regions at which two ends of the first strip electrodes are located, and the image luminance corresponding to the two ends of the first strip electrodes are both improved.

Approach 3): at least one of second strip electrodes is located at the region of the first strip electrodes that is far away from two ends of the first strip electrodes; the image luminance of the two ends of the first strip electrodes is comparable to that of the center region of the first strip electrodes, and the utilization rate of the liquid crystal molecules is higher. The arrangement provided via approach 3) is preferably applicable to the pixel electrode having a fold line-like shape, wherein the second strip electrode is located at the bending point of the first strip electrodes.

The above three types of non-closed structures are different from each other, which are implemented according to actual requirements, so it is not limited in particular herein.

The above three approaches that form non-closed structures with two adjacent first strip electrodes and a second strip electrode provided in the above embodiments are applicable to the first strip electrode having a line-like shape or a fold line-like shape.

In an example, the above three approaches that form non-closed structures with two adjacent first strip electrodes and a second strip electrode provided in the above embodiments are applicable to the first strip electrodes having a fold line-like shape.

In an example, when the first strip electrode is an electrode having a fold line-like shape, bending points of each of the first strip electrodes have the same bending direction and the same bending degree, and each bending point is located in a same line, and the electrode portions between the two ends and the bending point of the first strip electrode form a mirror symmetry.

When the first strip electrode is a strip electrode having a line-like shape, the liquid crystal molecules are distributed in single domain in the region corresponding to the first strip electrodes; when the first strip electrode is a strip electrode having a bending point, the liquid crystal molecules are distributed at least in double domains in the region corresponding to the first strip electrodes. The liquid crystal molecules distributed in double domains or multiple domains can broaden the viewing angle of a liquid crystal display panel.

In an example, referring to FIGS. 1, 2, 5 and 6, in the pixel electrodes provided in the embodiments of the present invention, the first strip electrode 1 has a bending point at center region (point o), each of the first strip electrodes 1 bends toward the same preset direction so that the two endpoints (endpoints a and b) and the bending point (point o) of the first strip electrode 1 form an isosceles triangle, wherein the bending point is a vertex of the isosceles triangle, and each first strip electrode corresponds identical isosceles triangle; that is, each first strip electrode has the same bending degree. In the pixel electrodes in FIGS. 1, 2, 5 and 6, the shape of the first strip electrodes 1 is similar to a bracket "<" or ">".

In an example, each of the first strip electrodes has the same width so that local electric field intensities in the liquid crystal layer are uniform, so as to improve quality of image display.

In an example, adjacent first strip electrodes has an identical spacing therebetween; that is, a slit between the two adjacent first strip electrodes has an identical width, so that local electric field intensities in the liquid crystal layer are uniform, so as to improve quality of image display.

In an example, the width of the second strip electrode is 1-2.5 μm so that each of the first strip electrodes electrically connects with each other to prevent poor display caused by bad contact between the first strip electrodes due to the narrower width of the second strip electrode.

In an example, each of the first strip electrodes has an identical width, the spacing between two adjacent first strip electrodes is identical to each other.

Typically, the width of an edge end of the pixel electrode, that is, the width of the second strip electrode, is about 1-2.5 μm. The liquid crystal molecules on closed end of each first strip electrode in the pixel electrode have a low efficiency area with a width of 5um or above 3 μm. The effective utilization of the liquid crystal molecules on opened end of each first strip electrode provided in the embodiments of the present invention is improved, thereby an aperture ratio of the pixel electrode having a width of 3 μm or above 3 μm is improved, and the light transmittance is improved.

Embodiment 2

A Pixel Electrode Includes Two Electrode Units

The arrangement of each electrode unit is similar to that of the electrode unit provided in the embodiment 1. The difference between them lies in that the pixel electrode of embodiment 2 is composed of two electrode units provided by embodiment 1.

Figure 7:
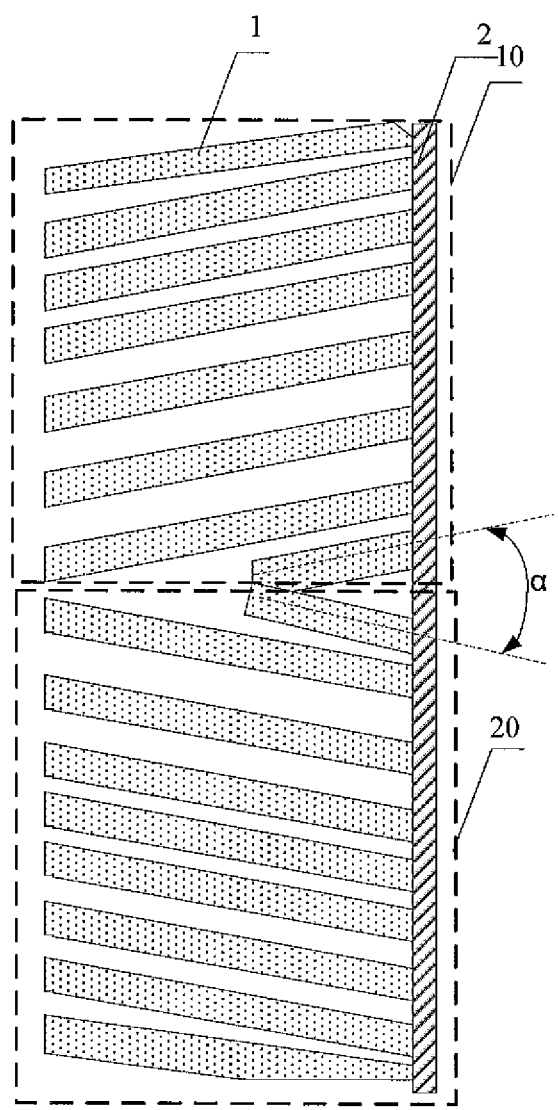
FIG. 7 shows a structural schematic view of a pixel electrode provided in a second embodiment of the present invention.

Referring to FIG. 7, the pixel electrode includes two electrode units, wherein the two electrode units respectively are a first electrode unit 10 and a second electrode unit 20. The first electrode unit 10 and the second electrode unit 20 are respectively electrode units provided by embodiment 1. That is, a slit is formed between adjacent first strip electrodes of the first electrode unit 10, thereby a slit electrode is formed; a slit is formed between adjacent first strip electrodes of the second electrode unit 20, thereby a slit electrode is formed; a second strip electrode 2 is located between any adjacent two first strip electrode 1 for connecting the two adjacent first strip electrodes 1. The two adjacent first strip electrodes 1 and the second strip electrode 2 located between them form a non-closed structure.

In an example, the first electrode unit 10 and the second electrode unit 20 can be in the same horizontal direction (lateral direction), also can be in the same vertical direction.

Referring to the pixel electrode as shown in FIG. 7, the first electrode unit 10 and the second electrode unit 20 are in the same vertical direction (longitudinal direction). The specific arrangement can be determined according to actual requirements, which is not limited in particular herein.

In an example, as shown in FIG. 7, each first strip electrode 1 of the first electrode unit 10 forms a mirror symmetry with each first strip electrode 1 of the second electrode unit 20; that is, each first strip electrode 1 of the first electrode unit 10 forms a mirror symmetry with each first strip electrode 1 of the second electrode unit 20 with respect to a boundary between the first electrode unit 10 and the second electrode unit 20.

In an example, as shown in FIG. 7, the first strip electrodes 1 of the first electrode unit 10 are arranged along a first direction, the first strip electrodes 1 of the second electrode unit are arranged along a second direction having a first angle α with the first direction, wherein the first angle α is an acute angle.

The two adjacent first strip electrodes 1 and the second strip electrode 2 located between them in the first electrode unit 10 form a non-closed structure, which is similar to one of the three types non-closed structures of the pixel electrode provided in the embodiment 1. The two adjacent first strip electrodes 1 and the second strip electrode 2 located between them in the second electrode unit 20 form a non-closed structure, which is similar to one of the three types non-closed structures of the pixel electrode provided in the embodiment 1.

In an example, referring to FIG. 7, one of the implementations is that each of the second strip electrodes 2 in the first electrode unit 10 and the second electrode unit 20 is located at a same end of each of the first strip electrodes 1. Each of the second strip electrodes 2 forms one strip electrode that connects each of the first strip electrodes 1 so that a voltage can be applied to each of the first strip electrodes 1 simultaneously. The pixel electrode shown in FIG. 7 is similar to a comb-shaped structure, the comb teeth of the comb-shaped pixel electrode has a fold line-like shape, and the first electrode unit 10 and the second electrode unit 20 of the comb-shaped pixel electrode are arranged in mirror symmetry.

Figure 8:
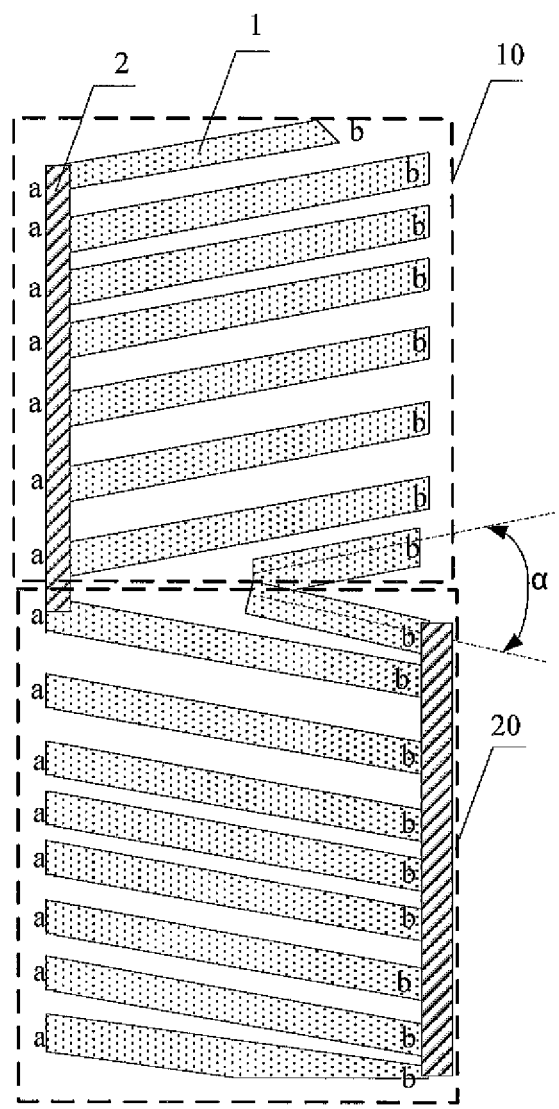
FIG. 8 shows another structural schematic view of the pixel electrode provided in the second embodiment of the present invention.

In an example, referring to FIG. 8, another of the implementations is that each of the second strip electrodes 2 in the first electrode unit 10 is located at a same end of each of the first strip electrodes 1, each of the second strip electrodes 2 in the second electrode unit 20 is located at the same end of each of the first strip electrodes 1, and each of the second strip electrodes 2 in the first electrode unit 10 is located at one end (end a) of each of the first strip electrodes 1, each of the second strip electrodes 2 in the second electrode unit 20 is located at the other end (end b) of each of the first strip electrodes 1. The pixel electrode shown in FIG. 8 is similar to a comb-shaped pixel electrode including two apertures towards opposite directions.

Figure 9:
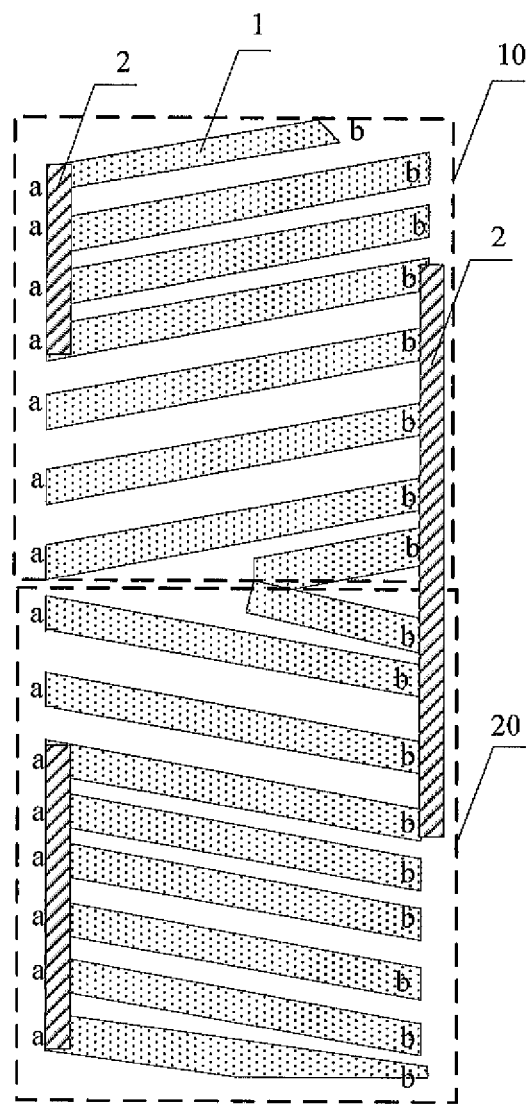
FIG. 9 shows a third structural schematic view of the pixel electrode provided in the second embodiment of the present invention.

In an example, referring to FIG. 9, a third implementation is that at least one of the second strip electrodes 2 is located at one end (end a) of each of the first strip electrodes 1, the other second strip electrodes 2 are located at the other end (end b) of each of the first strip electrodes 1. The pixel electrode shown in FIG. 9 is similar to a comb-shaped pixel electrode including a plurality of apertures towards opposite directions. Two adjacent comb-shaped pixel electrodes have different aperture directions.

For example, two adjacent comb-shaped pixel electrodes have a same aperture direction in the boundary region of adjacent electrode units.

The pixel electrode structures shown in FIGS. 7-10 are examples for illustrative purpose only, but they are not intended to limit the pixel electrode structures provided in the embodiments of the present invention. For example, the second strip electrode in the first electrode unit provided according to embodiments of the present invention can be located in the region besides the two ends of the first strip electrode, such as, it can be located at center region of the first strip electrode and between two adjacent first strip electrodes, as long as each of the first strip electrodes 1 connects with each other and at least one end of the first strip electrode has an aperture. For example, the first strip electrode 1 in the first electrode unit 10 partially overlaps with the first strip electrode 1 in the second electrode unit 20 in the boundary region between two adjacent electrode units.

In an example, in the pixel electrode structure provided in embodiment 2, the first electrode unit electrically connects with the second electrode unit, for example, the second strip electrode in the first electrode unit connects with the second strip electrode in the second electrode unit, or two nearest first strip electrodes in the first electrode unit and the second electrode unit connect with each other.

Figure 10:
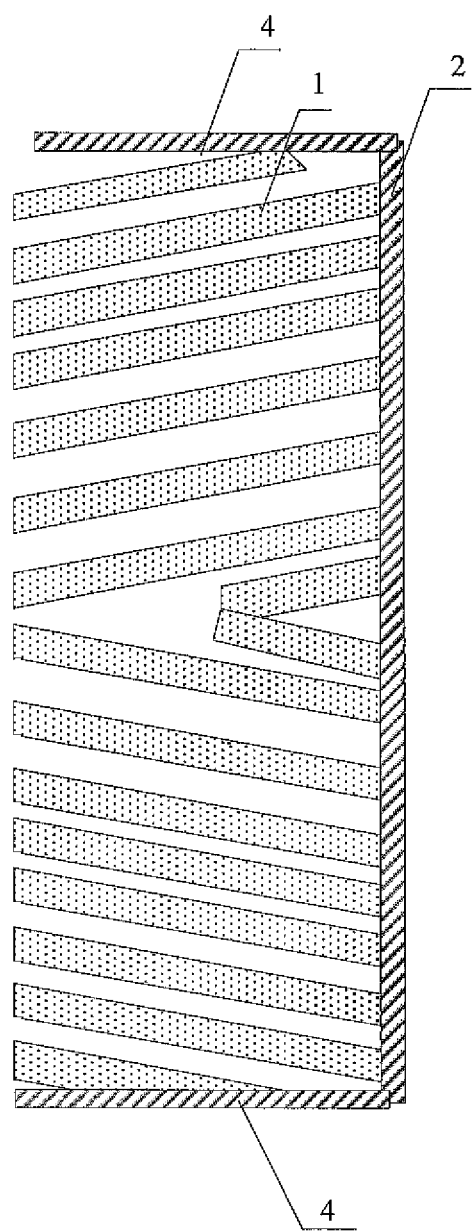
FIG. 10 shows a fourth structural schematic view of the pixel electrode provided in the second embodiment of the present invention.

In the pixel electrodes provided in the first embodiment and the second embodiment, a region at which each first strip electrode is located corresponds to a sub-pixel region. To further improve the light transmittance of the sub-pixel region provided in the embodiment 2, referring to FIG. 10, the pixel electrode provided in the embodiment 2 further includes a third strip electrode 4 located nearby outer edge of each electrode unit and arranged along a direction perpendicular to the second strip electrode 2. The third strip electrode 4 electrically connects with the second strip electrode 2 or the first strip electrode 1 at outer edge. The pixel electrode structure shown in FIG. 10 is described based on the pixel electrode structure shown in FIG. 7.

Array substrates provided in embodiments of the present invention will be described below with reference to the accompanying drawings.

Figure 11:
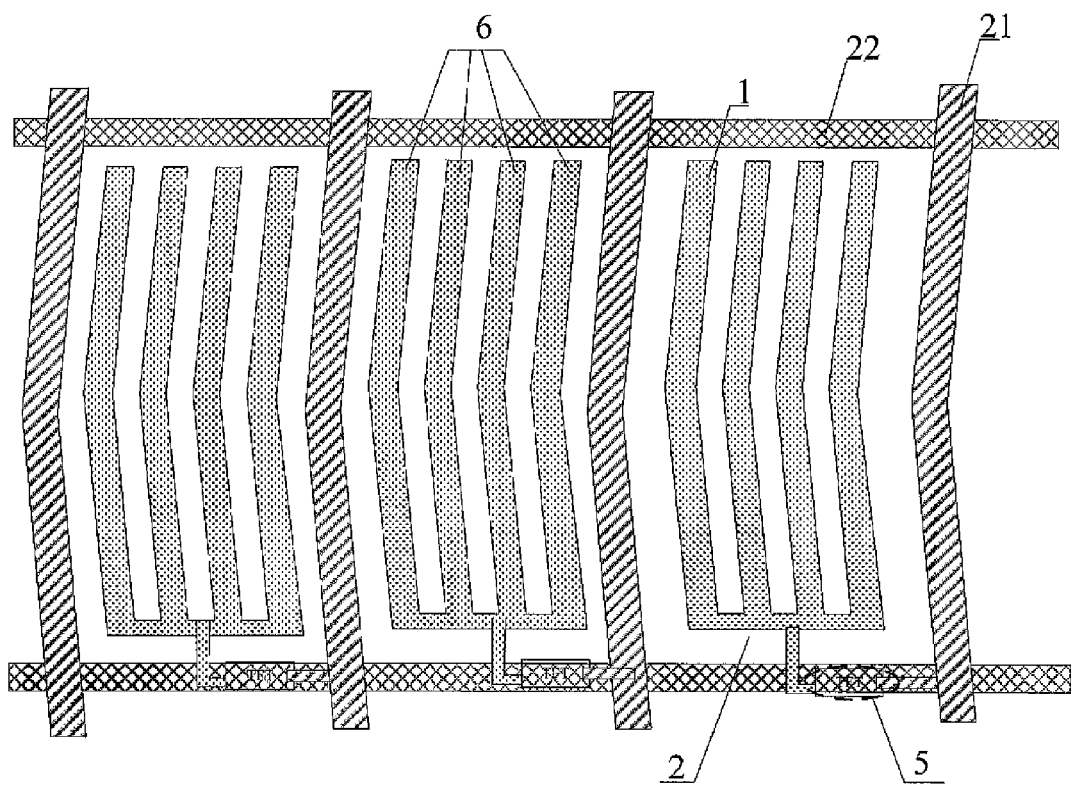
FIG. 11 shows a structural schematic view of an array substrate provided in an embodiment of the present invention.

Referring to FIG. 11, an array substrate provided in embodiments of the present invention includes data lines 21 located on the substrate and extending along a first direction, a plurality of gate lines 22 extending along a second direction intersect with the first direction and a plurality of sub-pixel units formed and surrounded by adjacent gate lines 22 and data lines 21. The sub-pixel unit includes pixel electrodes 6, wherein the pixel electrode 6 is the pixel electrode structure provided in embodiments of the present invention, which includes at least the structures provided in embodiment 1 and embodiment 2.

In an example, in all of the pixel electrodes provided in the embodiments of the present invention, the first strip electrodes are arranged along a direction in which the data lines extend, the second strip electrodes are arranged along a direction in which the gate lines extend; or the first strip electrodes are arranged along the direction in which the gate lines extend, the second strip electrodes are arranged along the direction in which the data lines extend. For example, in the pixel electrodes provided in the above embodiment 1, the first strip electrodes are arranged along a direction in which the data lines extend, the second strip electrodes are arranged along a direction in which the gate lines extend; or the first strip electrodes are arranged along the direction in which the gate lines extend, the second strip electrodes are arranged along the direction in which the data lines extend.

The first strip electrodes are arranged along a direction which has a second angle β with the gate lines, the second strip electrodes are arranged along the direction in which the data line extends. For example, in the pixel electrodes provided in the above embodiment 2, the first strip electrodes in the first electrode unit are arranged along the direction which has the second angle β with the gate line, the first strip electrodes in the second electrode unit are arranged along the direction which has the second angle β with the gate line. The first strip electrodes in the first electrode unit and the first strip electrodes in the second electrode unit form an angle of 2β.

The first strip electrodes are arranged along the direction which has the preset second angle β with the direction in which the gate line extends, the second strip electrodes are arranged along a direction which has a preset third angle γ with the direction in which the gate line extends.

The second angle β and the third angle γ are acute angles.

For example, each region of pixel units can include a thin film transistor (TFT) 5 connected with the pixel electrode 6, wherein the pixel electrode 6 connects with a drain of the thin film transistor 5.

Referring to FIG. 11, the pixel electrode structure provided in the embodiment 1 is illustrated as an example, it includes a plurality of first strip electrodes 1 extending in a same direction and a second strip electrode 2 located between two adjacent first strip electrodes configured to connect the two adjacent first strip electrodes. The two adjacent first strip electrodes 1 and the second strip electrode 2 form a non-closed structure.

The first strip electrodes 1 are provided along a direction in which data lines 21 extend.

The second strip electrodes 2 are distributed along a direction in which gate lines 22 extend.

In an example, referring to FIG. 11, the drain of the thin film transistor 5 connects with the second strip electrode 2 or the first strip electrode 1. In an example, referring to FIG. 11, the data line 21 has a bending point at the region corresponding to the bending point of the first strip electrode 1, and the data lines 21 and the first strip electrodes 1 bend toward a same preset direction.

Figure 12:
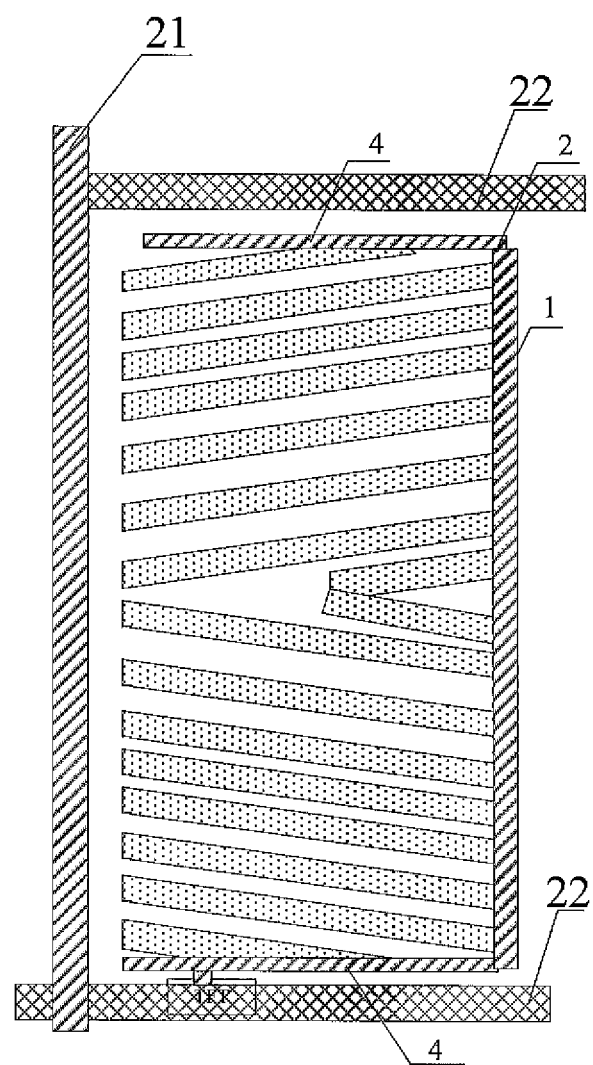
FIG. 12 shows another structural schematic view of the pixel electrode provided in an embodiment of the present invention.
Figure 13:
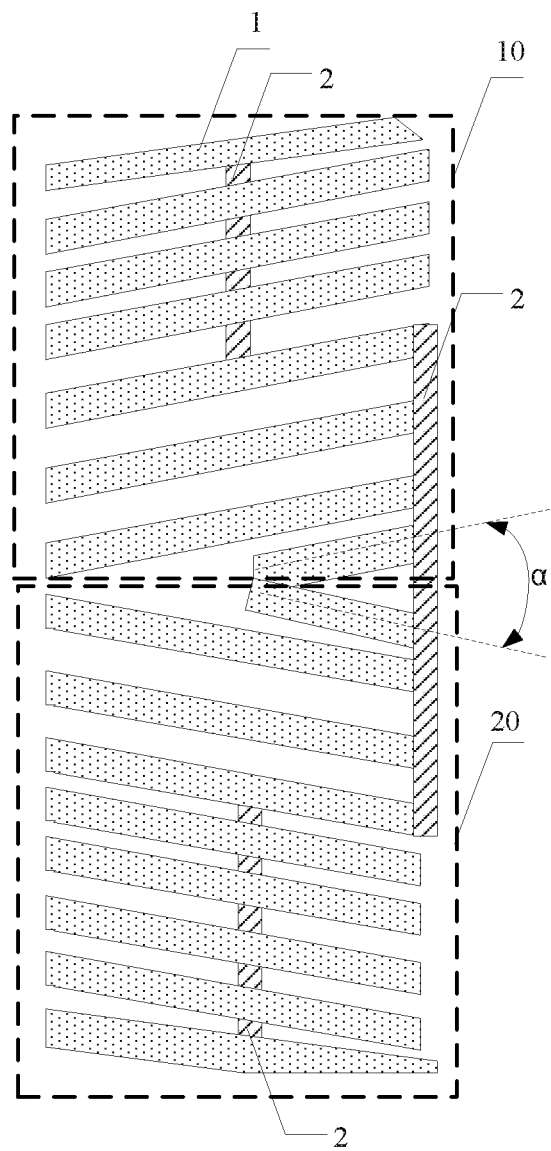
FIG. 13 shows a structural schematic view of a pixel electrode provided in an embodiment of the present invention.
Figure 14:
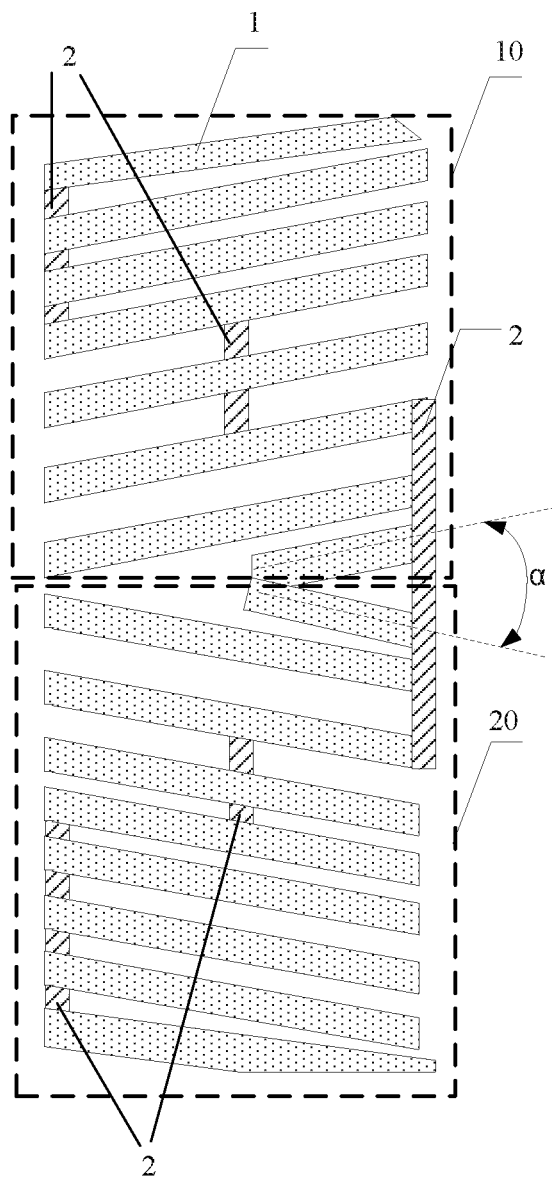
FIG. 14 shows a structural schematic view of a pixel electrode provided in another embodiment of the present invention.

Referring to FIG. 12, the pixel electrode structure provided in the embodiment 2 is illustrated as an example, it includes two electrode units. Each electrode unit includes a plurality of first strip electrodes 1 extending in a same direction and a second strip electrode 2 located between two adjacent first strip electrodes configured to connect the two adjacent first strip electrodes. The two adjacent first strip electrodes 1 and the second strip electrode 2 form a non-closed structure.

The extending directions of the first strip electrodes 1 as a whole are distributed along a direction in which gate lines 22 extend. The extending directions of the first strip electrodes 1 have a preset angle with the gate lines 22. The second strip electrodes 2 extend along a direction in which data line 21 extends.

The pixel electrode provided according to embodiments of the present invention includes at least one electrode unit, wherein the electrode unit includes a plurality of strip electrodes and has a non-closed shape. That is, one end of each strip electrode extends up to an edge of a sub-pixel and it does not connect with the end of adjacent strip electrode extending in the same direction. The liquid crystal molecules around the edge of sub-pixel have a higher utilization rate, and the light transmittance of the sub-pixel is improved.

Embodiments of the present invention provide a liquid crystal display panel. The liquid crystal display panel includes an array substrate and a color filter substrate assembled by bonding, where the array substrate is the described array substrate.

The liquid crystal display panel is a display panel based on ADS display mode or a liquid crystal display panel based on H-ADS or S-ADS display mode. The liquid crystal display panel can be a flat personal computer or a smart cell phone. In the liquid crystal display panel provided according to embodiments of the present invention, the aperture width of the pixel is increased at least by 3 μm, and the aperture ratio and light transmittance are substantially improved.

Embodiments of the present invention also provide a display device, the display device includes at least the described array substrate. The display device can be a liquid crystal panel, a liquid crystal display, a liquid crystal television or the like.

The description only illustratively describes the pixel electrodes provided in embodiments of the present invention. It should be noted that all of the array substrates and display devices including the pixel electrodes provided in embodiments of the present invention fall within the scope of the present invention.

It is understood that the described above are only illustrative embodiments and implementations for explaining the principle of the present invention, and the present invention is not intended to limited thereto. For one of ordinary skill in the art, various modifications and improvements may be made without departing from the spirit and scope of embodiments of the present invention, and all of which should fall within the protection scope of the present invention.

What is claimed is:

1. A pixel electrode, comprising:
a first electrode unit comprising a plurality of strip electrodes, wherein the first electrode unit has a non-closed shape, wherein the plurality of strip electrodes includes:
  a plurality of first strip electrodes extending along a first direction; and
  a plurality of second strip electrodes, each second strip electrode located between two corresponding adjacent first strip electrodes from the plurality of first strip electrodes and configured to connect the two corresponding adjacent first strip electrodes, wherein:
    the plurality of second strip electrodes includes at least one second strip electrode located between two adjacent first strip electrodes extending along the first direction in parallel;
    the at least one second strip electrode connects to a first one of the two adjacent first strip electrodes at a region of the first one of the two adjacent first strip electrodes that is between two ends of the first one of the two adjacent first strip electrodes; and
    the at least one second strip electrode connects to a second one of the two adjacent first strip electrodes at a region of the second one of the two adjacent first strip electrodes that is between two ends of the second one of the two adjacent first strip electrodes;
wherein the pixel electrode further comprises a second electrode unit that includes a second plurality of first strip electrodes arranged along a second direction, and wherein the first direction of the first strip electrodes of the first electrode unit and the second direction of the first strip electrodes of the second electrode unit form an acute angle.

2. The pixel electrode according to claim 1, wherein a structure formed by two corresponding adjacent first strip electrodes from the plurality of first strip electrodes and a corresponding second strip electrode from the plurality of second strip electrodes is not closed.

3. The pixel electrode according to claim 2, wherein part of the plurality of second strip electrodes are located at the same end of corresponding first strip electrodes from the plurality of first strip electrodes.

4. The pixel electrode according to claim 2, wherein at least another one second strip electrode from the plurality of second strip electrodes is located at one end of the plurality of first strip electrodes, and a remaining part of the plurality of second strip electrodes other than the at least one second strip electrode and the at least another one second strip electrode are located at the opposite end of the plurality of first strip electrodes.

5. The pixel electrode according to claim 4, wherein each of the plurality of first strip electrode has a line-like shape or a fold line-like shape with a bending point.

6. The pixel electrode according to claim 5, wherein when each of the plurality of first strip electrodes has the fold line-like shape with the bending point, each of the plurality of first strip electrodes has the same bending direction and the same bending degree, each of the bending points is located in a same line, and an electrode portion between the two ends and the bending point of each first strip electrode form a mirror symmetry.

7. The pixel electrode according to claim 1, wherein each of the plurality of first strip electrodes has a line-like shape or a fold line-like shape with a bending point.

8. The pixel electrode according to claim 7, wherein when each of the plurality of first strip electrodes has the fold line-like shape with the bending point, each of the plurality of first strip electrodes has a same bending direction and a same bending degree, each bending point is located in a same line, and an electrode portion between the two ends and the bending point of each first strip electrode form a mirror symmetry.

9. The pixel electrode according to claim 1, wherein the first electrode unit is electrically connected with the second electrode unit.

10. An array substrate, comprising:
a plurality of gate lines and a plurality of data lines arranged in an intersectant manner; and
a pixel unit formed and surrounded by the gate lines and the data lines;
wherein the pixel unit comprises a pixel electrode, and wherein the pixel electrode comprises a first electrode unit comprising a plurality of strip electrodes, wherein the first electrode unit has a non-closed shape, wherein the plurality of strip electrodes includes:
a plurality of first strip electrodes extending along a first direction; and
a plurality of second strip electrodes, each second strip electrode located between two corresponding adjacent first strip electrodes from the plurality of first strip electrodes and configured to connect the two corresponding adjacent first strip electrodes, wherein:

the plurality of second strip electrodes includes at least one second strip electrode located between two adjacent first strip electrodes extending along the first direction in parallel;
the at least one second strip electrode connects to a first one of the two adjacent first strip electrodes at a region of the first one of the two adjacent first strip electrodes that is between two ends of the first one of the two adjacent first strip electrodes; and
the at least one second strip electrode connects to a second one of the two adjacent first strip electrodes at a region of the second one of the two adjacent first strip electrodes that is between two ends of the second one of the two adjacent first strip electrodes;
wherein the pixel electrode further comprises a second electrode unit that includes a second plurality of first strip electrodes arranged along a second direction, and wherein the first direction of the first strip electrodes of the first electrode unit and the second direction of the first strip electrodes of the second electrode unit form an acute angle.

11. The array substrate according to claim 10, wherein:
the plurality of first strip electrodes are arranged along the first direction in which the data lines extend, the plurality of second strip electrodes extend along a direction in which the gate lines extend.

12. The array substrate according to claim 11, further comprising: a thin film transistor connected with each pixel electrode, wherein a drain of the thin film transistor is connected with the pixel electrode.

13. The array substrate according to claim 10, further comprising: a thin film transistor connected with each pixel electrode, wherein a drain of the thin film transistor is connected with the pixel electrode.

14. A display device, comprising the array substrate according to claim 10.

15. The array substrate according to claim 10, wherein the plurality of first strip electrodes is arranged along the first direction in which the gate lines extend, and the plurality of second strip electrodes extend along a direction in which the data lines extend.

16. The array substrate according to claim 10, wherein the plurality of first strip electrodes are arranged along the first direction which has an angle with the gate lines, and the plurality of second strip electrodes extend along a direction in which the data lines extend.

17. The array substrate according to claim 10, wherein the plurality of first strip electrodes are arranged along the first direction which has an angle with a direction in which the gate lines extend, and the plurality of second strip electrodes extend along a direction which has another angle with a direction in which the data lines extend.

* * * * *